United States Patent
Tan et al.

[11] Patent Number: 6,054,361
[45] Date of Patent: Apr. 25, 2000

[54] PRESERVING THE ZERO MARK FOR WAFER ALIGNMENT

[75] Inventors: Juan Boon Tan; Zuo Yang; Tsun Lung Cheng, all of Singapore, Singapore

[73] Assignee: Chartered Semiconductor Manufacturing, Ltd., Singapore, Singapore

[21] Appl. No.: 09/247,973

[22] Filed: Feb. 11, 1999

[51] Int. Cl.[7] .................................................. H01L 21/76
[52] U.S. Cl. .......................................... 438/401; 438/692
[58] Field of Search .................................. 438/401, 459, 438/691–692; 148/DIG. 102

[56] References Cited

U.S. PATENT DOCUMENTS

| | | | |
|---|---|---|---|
| 5,270,255 | 12/1993 | Wong | 437/194 |
| 5,271,798 | 12/1993 | Sandhu et al. | 156/638 |
| 5,316,966 | 5/1994 | Van Der Plas et al. | |
| 5,496,777 | 3/1996 | Moriyama | 437/249 |
| 5,532,520 | 7/1996 | Haraguchi et al. | 257/797 |
| 5,627,624 | 5/1997 | Yim et al. | 355/53 |
| 5,640,053 | 6/1997 | Caldwell | 257/797 |
| 5,705,320 | 1/1998 | Hsu et al. | 430/313 |
| 5,733,801 | 3/1998 | Gojohbori | |

Primary Examiner—Jey Tsai
Attorney, Agent, or Firm—George O. Saile; Rosemary L.S. Pike; Larry J. Prescott

[57] ABSTRACT

A method of preserving alignment marks through steps of depositing intermetal dielectric, depositing refractory metal, and planarizing the wafer is described. After deposition of a layer of first metal a layer of first intermetal dielectric is deposited on an integrated circuit wafer. The first intermetal dielectric is then etched away from the alignment region of the wafer. A layer of second metal is then deposited. A layer of second intermetal dielectric is then deposited. The layer of second intermetal dielectric is left in place in the alignment region, a layer of refractory metal is deposited, and the wafer is planarized. The refractory metal and second intermetal dielectric are then cleared from the alignment region. The second intermetal dielectric protects the alignment marks during wafer planarization. A layer of third metal can then be deposited and the alignment marks are be preserved.

18 Claims, 5 Drawing Sheets

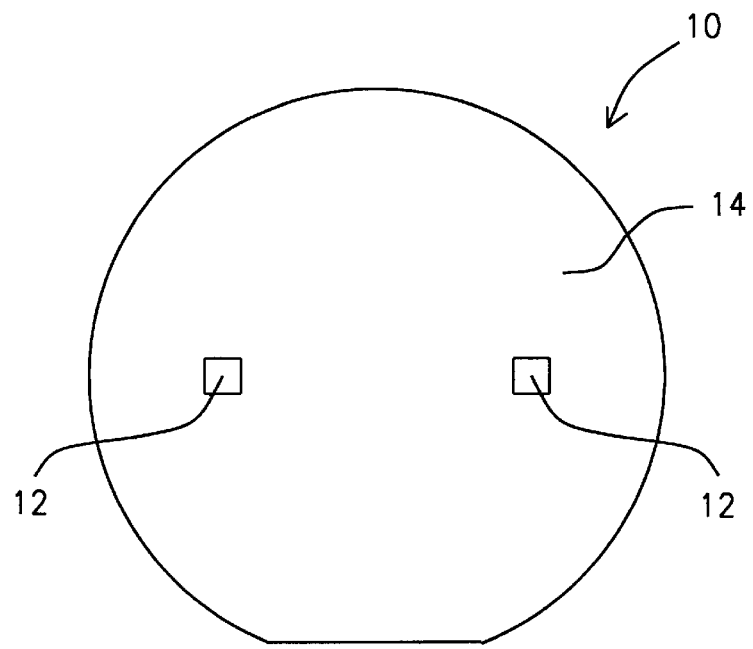
FIG. 1 – Prior Art
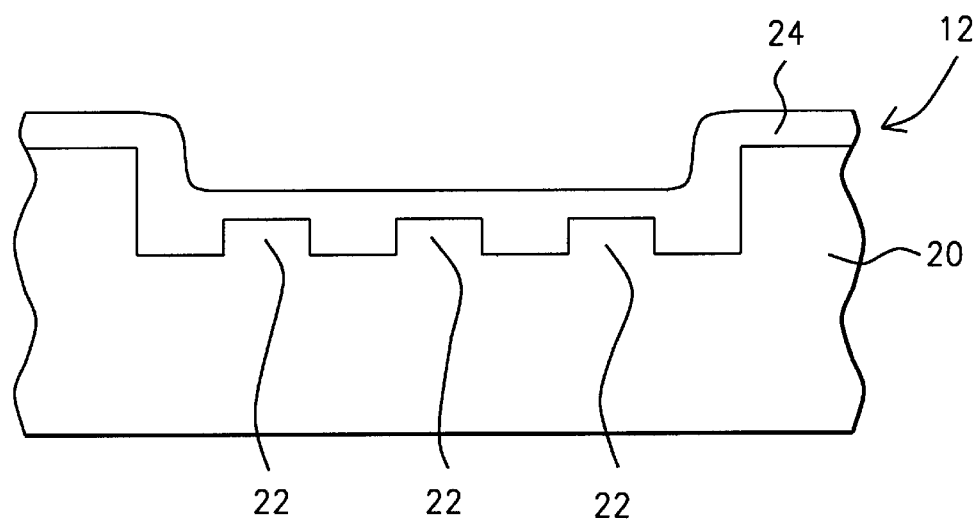
FIG. 2 – Prior Art

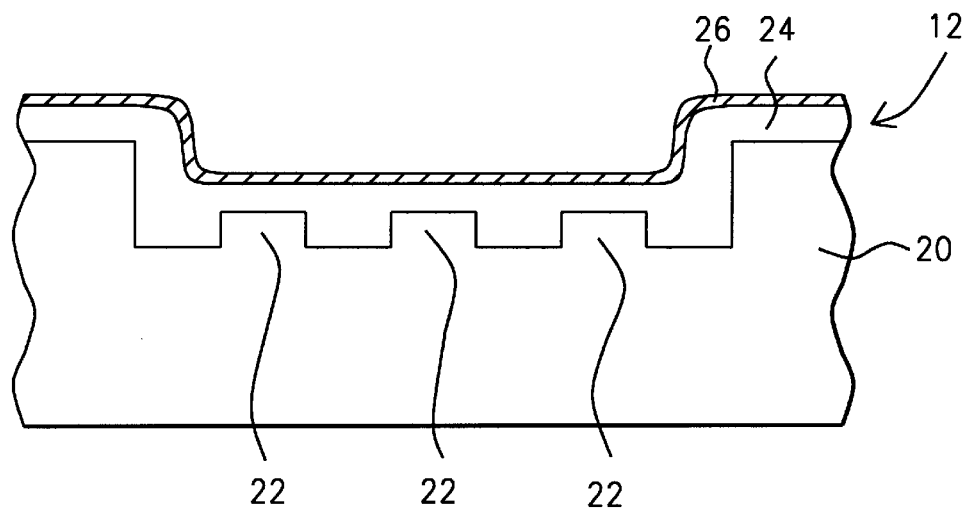
FIG. 3 — Prior Art
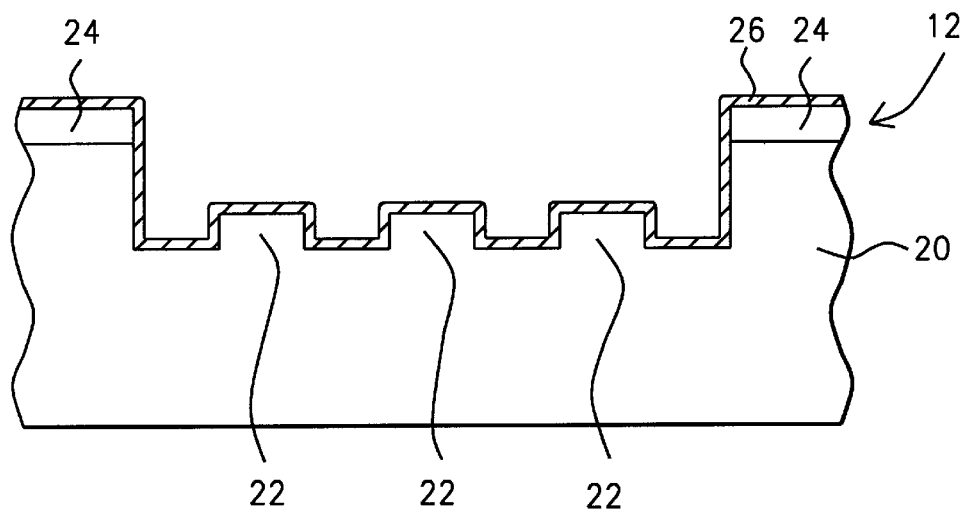
FIG. 4 — Prior Art

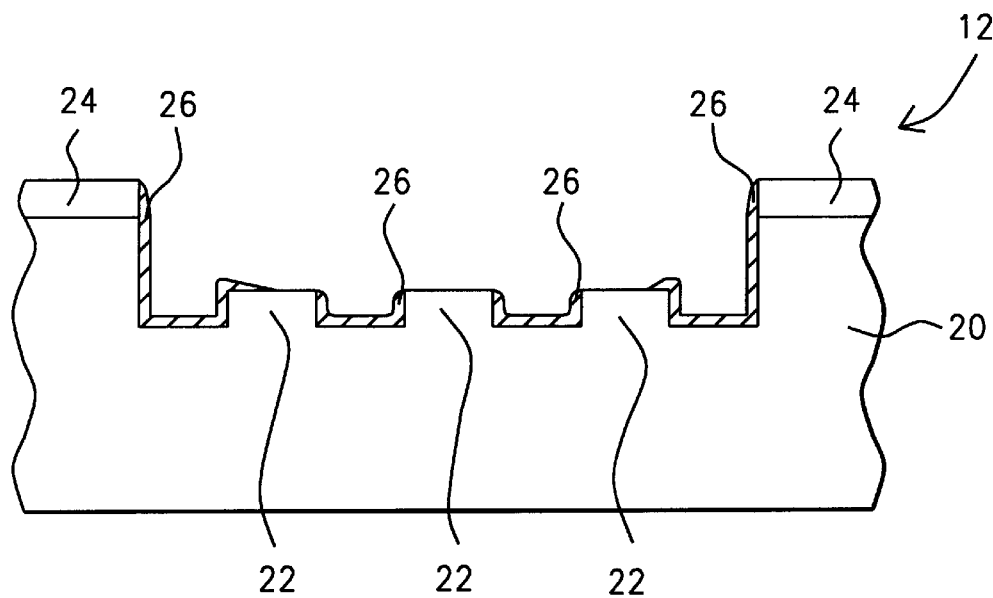
FIG. 5 - Prior Art
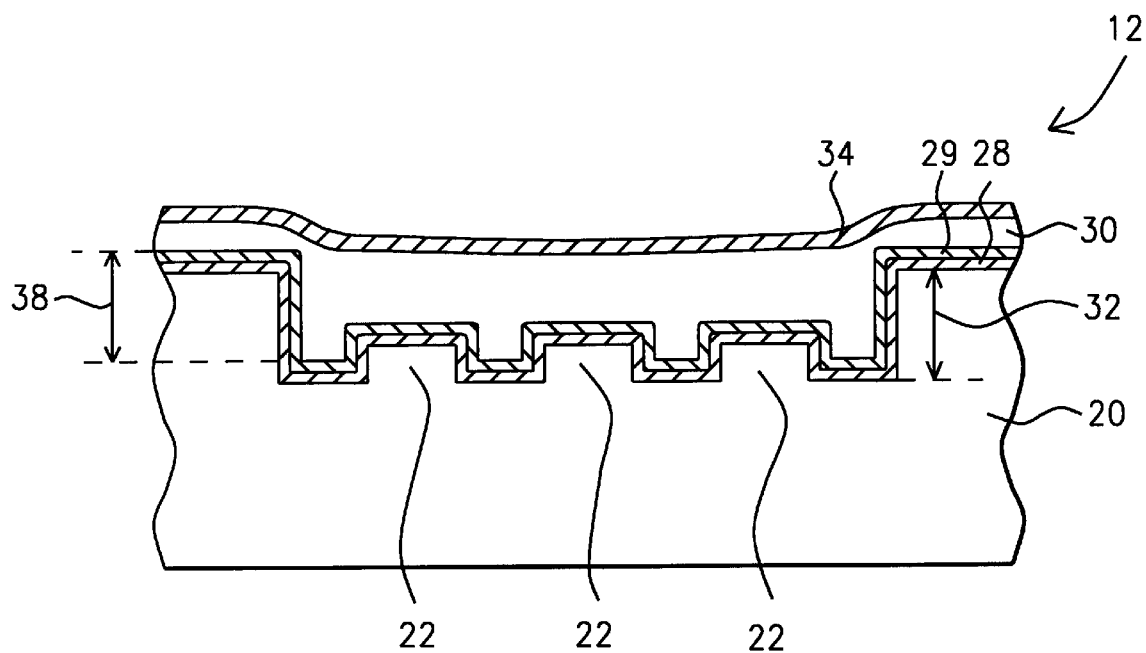
FIG. 6

PRESERVING THE ZERO MARK FOR WAFER ALIGNMENT

BACKGROUND OF THE INVENTION

(1) Field of the Invention

This invention relates to preserving the zero alignment mark for wafer alignment after wafer planarization and more particularly to preserving the primary or zero alignment mark for processes which use tungsten chemical mechanical polishing during the process sequence.

(2) Description of the Related Art

U.S. Pat. No. 5,496,777 to Moriyama describes a method of arranging alignment marks used in different process steps on scribing lines.

U.S. Pat. No. 5,532,520 to Haraguchi et al. describes alignment marks for the X direction alignment of a chip on a semiconductor wafer. The alignment marks comprise recesses and projections which are smaller than the X directional width of a grain on a metal film or the average particle size. The projections may be formed by an insulating layer formed on the semiconductor substrate.

U.S. Pat. No. 5,270,255 to Wong describes a method of metallization of an integrated circuit wafer which provides good step coverage and maintains a useful alignment mark. At least one contact opening to the semiconductor substrate and at least one lithography alignment cross mark opening structure are formed.

U.S. Pat. No. 5,627,624 to Yim et al. describes an integrated circuit test reticle for alignment mark optimization. A test reticle using alignment mark shapes, sizes, and depths is described.

U.S. Pat. No. 5,705,320 to Hsu et al. describes a method of preserving alignment marks after chemical mechanical polishing using a clear out window in the frame area of the contact via reticle.

U.S. Pat. No. 5,640,053 to Caldwell describes an inverse open frame alignment mark.

U.S. Pat. No. 5,271,798 to Sandhu et al. describes a method of selectively removing material from the alignment region of a wafer. Methods of confining etching materials to the alignment region are described.

SUMMARY OF THE INVENTION

Alignment marks are essential in photolithographic processing of semiconductor wafers for aligning the various masks used to pattern different levels of metallurgy and conductors to the wafer. As various processing steps are completed, care must be taken to insure that the alignment marks remain visible so that they can be used for subsequent processing steps. FIG. 1 shows a typical semiconductor wafer 10 having two alignment regions 12 and a device region 14. FIG. 2 shows typical alignment marks 22 formed in an alignment region 12 of the wafer 20. Typically the alignment marks 22 have sharp edges which can be detected automatically in a tool such as a wafer stepper used to project mask images onto the wafer. Wafer processing often comprises deposition of transparent layers of dielectric materials 24 such as silicon oxide or the like. After deposition of these transparent layers the alignment marks 22 are still visible and can still be detected using automatic means.

As shown in FIG. 3 metal conducting layers 26 are deposited on the dielectric layers 24. These metal conducting layers 26 are opaque and reflective and make the alignment marks 22 unusable unless steps are taken to preserve or recover the alignment marks. One method of preserving the alignment marks is to etch away the dielectric in the alignment region before the metal is deposited, as shown in FIG. 4. With this method, however, subsequent wafer planarization, such as with chemical mechanical polishing, can distort the edges of the alignment marks 22 so that they lose effectiveness as alignment marks, as shown in FIG. 5.

It is a principle objective of this invention to provide a method of preserving alignment marks after metal layers have been deposited and the wafer has been planarized.

This objective is achieved by depositing a thicker layer of intermetal dielectric prior to the deposition of the metal layer. The metal layer is then deposited followed by planarization of the wafer. Since the dielectric is still in place in the alignment region the alignment marks are protected during the chemical mechanical polishing operation. The metal and dielectric are then etched away from the alignment regions of the wafer leaving the alignment marks in their original condition. The next layer of metal is then deposited and conform to the shape of the alignment marks so that the alignment marks can still be detected to align the wafer for subsequent process steps.

BRIEF DESCRIPTION OF THE DRAWINGS

FIG. 1 shows a top surface of a wafer showing two alignment regions.

FIG. 2 shows a cross section view of an alignment region of a wafer showing alignment marks and a layer of dielectric.

FIG. 3 shows a cross section view of an alignment region of a wafer with a layer of metal deposited on the layer of dielectric.

FIG. 4 shows a cross section of an alignment region of a wafer with the dielectric cleared from the alignment region before the layer of metal is deposited.

FIG. 5 shows a cross section view of an alignment region of a wafer with the dielectric cleared from the alignment region before the metal is deposited after planarization of the wafer.

FIG. 6 shows a cross section of an alignment region of a wafer after forming a layer of dielectric and depositing a layer of metal.

DESCRIPTION OF THE PREFERRED EMBODIMENTS

Figure 7:
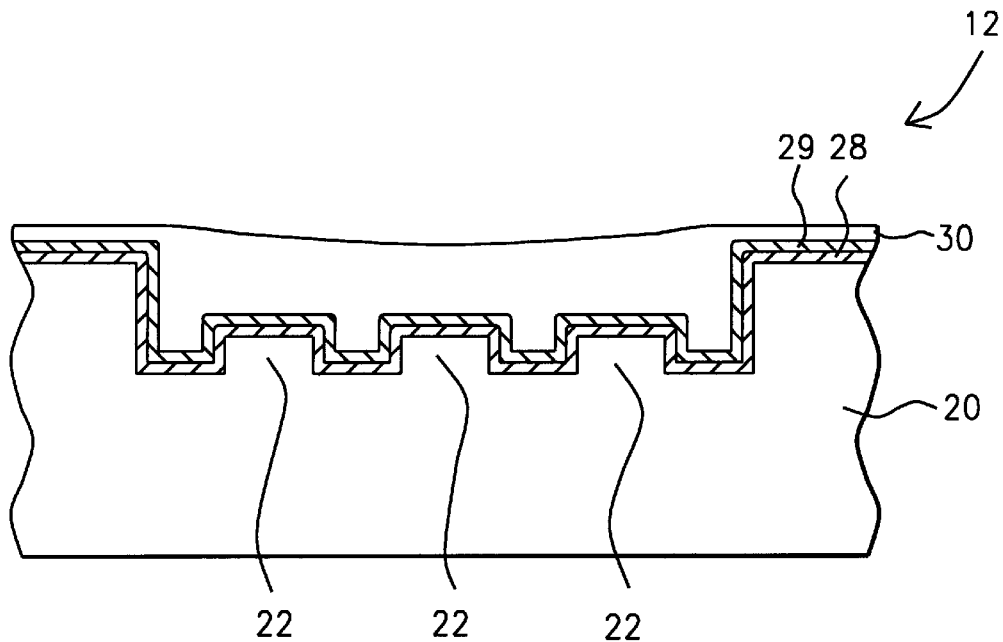
FIG. 7 shows a cross section of an alignment region of a wafer after forming a layer of dielectric, depositing a layer of metal, and planarizing the wafer.

Refer now to FIGS. 1, and 6–9 for a description of the preferred embodiment of this invention. FIG. 1 shows a top view of an integrated circuit wafer 10 having a device region 14 and two alignment regions 12. The device region 14 of the wafer is the region where the integrated circuit devices will be formed and interconnected. The alignment regions 12 of the wafer are reserved for alignment marks. FIG. 6 shows a cross section view of one of the alignment regions 12 having alignment marks 22 formed therein. In this example a layer of first conductor material 28, such as a metal, has been deposited in order to form conducting electrodes for the device region of the wafer. A layer of first intermetal dielectric, such as silicon oxide, has been deposited on the first layer of conductor material, however this first intermetal dielectric has been etched away from the alignment regions 12 in order to preserve the alignment marks 22 and is not shown in FIG. 6.

A layer of second conductor material 29, such as a metal, is then deposited in order to form conducting electrodes for the device region of the wafer. In the device region of the wafer, not shown here, the layer of second conductor material is formed on the layer of first intermetal dielectric. In the alignment regions, as shown in FIG. 6, the layer of second conductor material 29 is deposited directly on the layer of first conductor material 28. The layer of first conductor material 28 and the layer of second conductor material 29 conform to the shape of the alignment marks 22 so that the alignment marks can still be used for accurate alignment of the wafer in a tool such as a wafer stepper.

The steps that follow are the key steps in this invention of a method to preserve alignment marks. As shown in FIG. 6, the alignment marks 22 are formed in an alignment region 12 having sidewalls and a bottom, the sidewalls having a depth 38 equal to a first thickness. The first thickness in this example is between about 36,000 and 44,000 Angstroms. Next, as shown in FIG. 6, a layer of second intermetal dielectric 30, having a second thickness, is deposited over the layer of second conductor material 29. The second intermetal dielectric 30 is a material such as silicon oxide or the like. The second thickness is increased over that which is often used for a second intermetal dielectric so that the second thickness is between about 18,000 and 20,000 Angstroms less than the first thickness, which is the depth of the sidewalls of the alignment region. In this example the second thickness is between about 20,000 and 22,000 Angstroms.

Next, as shown in FIG. 6, a layer of refractory metal 34, such as tungsten, having a thickness of between about 4000 and 5000 Angstroms is deposited on the layer of second intermetal dielectric 30. This example describes a layer of refractory metal 34 deposited on the layer of second intermetal dielectric 30. Those skilled in the art will recognize that the method of this invention will also work if a layer of other metal or amorphous silicon is deposited on the layer of intermetal dielectric 30 instead of the layer of refractory metal. The refractory metal 34 is typically used to fill via holes in the device region of the wafer, not shown. Next, as shown in FIG. 7, the wafer is planarized using a method such as chemical mechanical polishing. This planarization removes the refractory metal 34 from the top surface of the layer of second intermetal dielectric 30. The dishing effect of the planarization helps in removing the metal from the alignment region.

Figure 8:
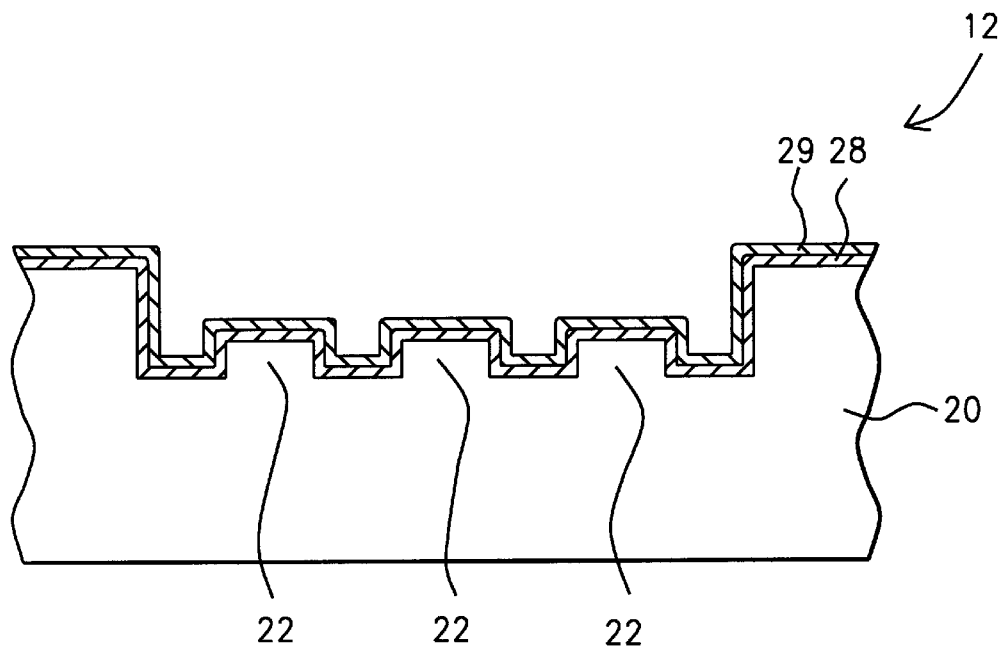
FIG. 8 shows a cross section of an alignment region of a wafer after planarizing the wafer and removing dielectric from the alignment region.

As shown in FIG. 8, a resist mask is then formed protecting the device region of the wafer and any refractory metal remaining in the alignment region of the wafer is etched away. The second intermetal dielectric is then etched away from the alignment region using dry etching with an etchant of $CHF_3+CF_4$. The etching method and etchant are chosen to provide a strong oxide etch, which also helps to remove any remaining metal or metal residue.

Figure 9:
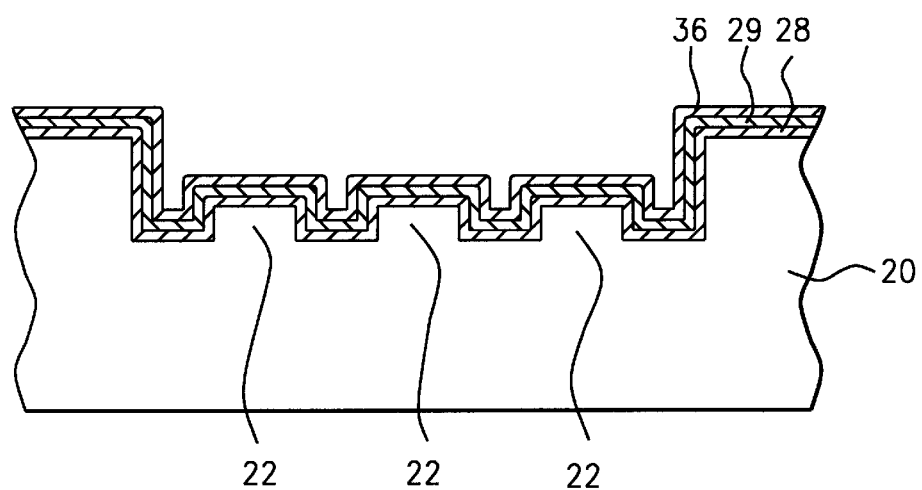
FIG. 9 shows a cross section of an alignment region of a wafer after planarizing the wafer, removing dielectric from the alignment region, and depositing a subsequent layer of metal.

As shown in FIG. 9, a layer of third conductor material 36, such as aluminum copper or the like, or a layer of other opaque material can then be deposited on the wafer and the alignment marks 22 are preserved. In the alignment region the layer of third conductor material 36 is deposited directly on the layer of second conducting material 29. In this method the layer of second intermetal dielectric protects the alignment marks during the chemical mechanical polishing operation. The second intermetal dielectric is then etched away and the alignment marks are preserved after deposition of the layer of third conductor material.

While the invention has been particularly shown and described with reference to the preferred embodiments thereof, it will be understood by those skilled in the art that various changes in form and details may be made without departing from the spirit and scope of the invention.

What is claimed is:

1. A method of preserving alignment marks, comprising:
   providing a semiconductor wafer having alignment regions and device regions;
   providing alignment marks formed in said alignment regions;
   forming a patterned layer of first conducting material on said alignment regions and said device region of said semiconductor wafer;
   forming a layer of first intermetal dielectric on said layer of first conducting material;
   clearing said first intermetal dielectric from said alignment regions;
   forming a patterned layer of second conducting material on said alignment regions and said device regions of said semiconductor wafer, thereby forming alignment regions having sidewalls with a first thickness;
   forming a layer of second intermetal dielectric having a second thickness on said alignment regions and said device regions of said semiconductor wafer, wherein said second thickness is between about 18,000 and 20,000 Angstroms less than said first thickness;
   depositing a layer of refractory metal on said layer of second intermetal dielectric;
   planarizing said semiconductor wafer after depositing said layer of refractory metal;
   forming a photoresist mask on said wafer after planarizing said wafer wherein said photoresist mask covers said device regions and does not cover said alignment regions of said wafer;
   etching away said refractory metal from said alignment regions of said wafer using said photoresist mask;
   etching away said second intermetal dielectric from said alignment regions of said wafer using said photoresist mask;
   removing said photoresist mask; and
   forming a patterned layer of third conducting material on said wafer.

2. The method of claim 1 wherein said planarizing said semiconductor wafer uses chemical mechanical polishing.

3. The method of claim 1 wherein said layer of refractory metal is a layer of tungsten having a thickness of between about 4000 and 5000 Angstroms.

4. The method of claim 1 wherein said first thickness is between about 36,000 and 44,000 Angstroms.

5. The method of claim 1 wherein said second thickness is between about 20,000 and 22,000 Angstroms.

6. The method of claim 1 wherein said etching away said second intermetal dielectric from said alignment regions uses dry etching with an etchant of $CHF_3+CF_4$.

7. The method of claim 1 wherein said second intermetal dielectric is silicon oxide.

8. The method of claim 1 wherein said layer of third conducting material is a layer of aluminum copper.

9. The method of claim 1 wherein said layer of third conducting material is a layer of opaque material.

10. The method of claim 1 wherein said layer of first intermetal dielectric is a layer of silicon oxide.

11. A method of preserving alignment marks, comprising:

providing a substrate having alignment regions and device regions, wherein said alignment regions have sidewalls having a first thickness and bottoms;

providing alignment marks formed on said bottoms of said alignment regions;

forming a layer of intermetal dielectric having a second thickness on said alignment regions and said device regions of said semiconductor wafer, wherein said second thickness is between about 18,000 and 20,000 Angstroms less than said first thickness;

depositing a layer of refractory metal on said layer of intermetal dielectric;

planarizing said substrate;

forming a photoresist mask on said substrate after planarizing said substrate wherein said photoresist mask does not cover said alignment regions of said substrate;

etching away said refractory metal from said alignment regions of said substrate using said photoresist mask;

etching away said intermetal dielectric from said alignment region of said wafer using said photoresist mask; and removing said photoresist mask.

12. The method of claim 11 wherein said substrate is a semiconductor integrated circuit wafer.

13. The method of claim 11 wherein said planarizing said substrate uses chemical mechanical polishing.

14. The method of claim 11 wherein said layer of refractory metal is a layer of tungsten having a thickness of between about 4000 and 5000 Angstroms.

15. The method of claim 11 wherein said first thickness is between about 36,000 and 44,000 Angstroms.

16. The method of claim 11 wherein said second thickness is between about 20,000 and 22,000 Angstroms.

17. The method of claim 11 wherein said etching away said intermetal dielectric from said alignment regions uses dry etching with an etchant of $CHF_3+CF_4$.

18. The method of claim 1 wherein said intermetal dielectric is silicon oxide.

* * * * *